United States Patent
Zhao et al.

(10) Patent No.: US 8,456,781 B2
(45) Date of Patent: Jun. 4, 2013

(54) TMR DEVICE WITH NOVEL FREE LAYER STRUCTURE

(75) Inventors: Tong Zhao, Fremont, CA (US);
Hui-Chuan Wang, Pleasanton, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/561,206

(22) Filed: Jul. 30, 2012

(65) Prior Publication Data

US 2013/0001189 A1    Jan. 3, 2013

Related U.S. Application Data

(63) Continuation of application No. 12/658,005, filed on Feb. 1, 2010, now Pat. No. 8,259,420.

(51) Int. Cl.
*G11B 5/39* (2006.01)
*C21D 1/04* (2006.01)

(52) U.S. Cl.
USPC ............... 360/324.12; 148/108; 29/603.18; 29/603.08

(58) Field of Classification Search
USPC ..... 360/324–324.2; 148/108, 121; 29/603.07, 29/603.08, 603.13, 603.14
See application file for complete search history.

(56) References Cited

U.S. PATENT DOCUMENTS

| | | | |
|---|---|---|---|
| 6,841,395 B2 | 1/2005 | Linn et al. |
| 6,982,932 B2 | 1/2006 | Sakakima et al. |
| 7,333,306 B2 | 2/2008 | Zhao et al. |
| 7,418,777 B2 | 9/2008 | Amano et al. |
| 7,602,033 B2 | 10/2009 | Zhao et al. |
| 7,630,177 B2 | 12/2009 | Beach et al. |
| 7,780,820 B2 | 8/2010 | Zhao et al. |
| 7,800,868 B2 | 9/2010 | Gao et al. |
| 7,851,840 B2 | 12/2010 | Diao et al. |

(Continued)

FOREIGN PATENT DOCUMENTS

WO    WO 2011030529 A1  *  3/2011

OTHER PUBLICATIONS

"Ultralow resistance-area product of 0.4 $\Omega$ $(\mu m)^2$ and high magnetoresistance above 50% in CoFeB/MgO/CoFeB magnetic tunnel junctions," by Yoshinori Nagamine et al., Applied Physics Letters 89, 162507, Oct. 2006, pp. 1-3.

(Continued)

*Primary Examiner* — Will J Klimowicz
(74) *Attorney, Agent, or Firm* — Saule Ackerman LLC; Stephen B. Ackerman

(57) ABSTRACT

A composite free layer having a FL1/insertion/FL2 configuration where a top surface of FL1 is treated with a weak plasma etch is disclosed for achieving enhanced dR/R while maintaining low RA, and low $\lambda$ in TMR or GMR sensors. The weak plasma etch removes less than about 0.2 Angstroms of FL1 and is believed to modify surface structure and possibly increase surface energy. FL1 may be CoFe, CoFe/CoFeB, or alloys thereof having a (+) $\lambda$ value. FL2 may be CoFe, NiFe, or alloys thereof having a (−) $\lambda$ value. The thin insertion layer includes at least one magnetic element such as Co, Fe, and Ni, and at least one non-magnetic element. When CoFeBTa is selected as insertion layer, the CoFeB:Ta ratio is from 1:1 to 4:1.

10 Claims, 4 Drawing Sheets

U.S. PATENT DOCUMENTS

| | | | |
|---|---|---|---|
| 8,048,492 B2 | 11/2011 | Fukuzawa et al. | |
| 8,059,374 B2 | 11/2011 | Zhao et al. | |
| 8,254,067 B2 * | 8/2012 | Nishioka et al. | 360/324.2 |
| 8,259,420 B2 * | 9/2012 | Zhao et al. | 360/324.12 |
| 2008/0152834 A1 | 6/2008 | Pinarbasi | |
| 2009/0121710 A1 | 5/2009 | Wang et al. | |
| 2009/0122450 A1 | 5/2009 | Wang et al. | |
| 2009/0229111 A1 | 9/2009 | Zhao et al. | |
| 2010/0103564 A1 * | 4/2010 | Nishioka et al. | 360/319 |
| 2010/0240151 A1 * | 9/2010 | Belen et al. | 438/3 |
| 2010/0276272 A1 * | 11/2010 | Zheng et al. | 204/192.11 |

OTHER PUBLICATIONS

"Giant tunneling magnetoresistance effect in low-resistance CoFeB/MgO(001)/CoFeB magnetic tunnel junctions for read-head application," by Koji Tsunekawa et al., Applied Physics Letters 87, 072503, Aug. 2005, pp. 1-3.

"230% room-temperature magnetoresistance in CoFeB/MgO/CoFeB magnetic tunnel junctions," by David D. Djayaprawira et al., Applied Physics Letters 86, 092502, Feb. 2005, pp. 1-3.

"Giant tunnelling magnetoresistance at room temperature with MgO(100) tunnel barriers," by Stuart S. P. Parkin et al., 2004 Nature Publishing Group, nature materials/vol. 3/Dec. 2004/www.nature.com/naturematerials, pp. 862-867.

"Giant tunneling magnetoresistance up to 410% at room temperature in fully epitaxial Co/MgO/Co magnetic tunnel junctions with bcc Co(001) electrodes," by Shinji Yuasa et al., Applied Physics Letters 89, 042505, Jul. 2006, pp. 1-3.

"Giant room-temperature magnetoresistance in single-crystal Fe/MgO/Fe magnetic tunnel junctions," by Shinji Yuasa et al., 2004 Nature Publishing Group, nature materials/ vol. 3/ Dec. 2004/ www.nature.com/naturematerials, pp. 868-871.

* cited by examiner

TMR DEVICE WITH NOVEL FREE LAYER STRUCTURE

This is a continuation of U.S. patent application Ser. No. 12/658,005, filed on Feb. 1, 2010, now U.S. Pat. No. 8,259, 420 B2; which is herein incorporated by reference in its entirety, and assigned to a common assignee.

RELATED PATENT APPLICATIONS

This application is related to the following: U.S. Patent Application Publication 2009/0122450; U.S. Patent Application Publication 2009/0121710; and U.S. Pat. No. 8,059,374; all assigned to a common assignee, and which are herein incorporated by reference in their entirety.

FIELD OF THE INVENTION

The invention relates to a high performance tunneling magnetoresistive (TMR) sensor in a read head and a method for making the same, and in particular, to a first ferromagnetic layer (FL1) in a composite free layer represented by a FL1/INS/FL2 configuration in which the FL1 surface structure and surface energy are modified by a weak plasma etch treatment before an insertion layer (INS) and second ferrormagnetic layer (FL2) are deposited thereby increasing the magnetoresistive (MR) ratio while maintaining strong coupling between the FL1 and FL2 magnetic layers.

BACKGROUND OF THE INVENTION

A TMR sensor otherwise known as a magnetic tunneling junction (MTJ) is a key component in magnetic devices such as Magnetic Random Access Memory (MRAM) and a magnetic recording head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive layer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgO based MTJ is a very promising candidate for high frequency recording applications because its tunneling magnetoresistive (TMR) ratio is significantly higher than for AlOx or TiOx based MTJs as demonstrated by S. Yuasa et al. in "Giant room-temperature magnetoresistance in single crystal Fe/MgO/Fe magnetic tunnel junctions", Nature Materials, 3, 868-871 (2004), and in "Giant tunneling magnetoresistance up to 410% at room temperature in fully epitaxial Co/MgO/Co magnetic tunnel junctions with bcc Co(001) electrodes", Appl. Phys. Lett., 89, 042505 (2006), and by S. Parkin et al. in "Giant tunneling magnetoresistance at room temperature with MgO (100) tunnel barriers", Nature Materials, 3, 862-867 (2004).

CoFeB has been used in the free layer for MgO based MTJs to achieve high MR ratio and a soft magnetic layer. D. Djayaprawira et al. showed that MTJs with a CoFeB/MgO (001)/CoFeB structure made by conventional sputtering can also have a very high MR ratio of 230% with advantages of better flexibility and uniformity in "230% room temperature magnetoresistance in CoFeB/MgO/CoFeB magnetic tunnel junctions", Physics Letters 86, 092502 (2005).

For a low RA application, the MR ratio of CoFeB/Mg/MgO/CoFeB MTJs can reach 138% at RA=2.4 ohm/$\mu m^2$ according to K. Tsunekawa et al. in "Giant tunneling magnetoresistance effect in low resistance CoFeB/MgO(001)/CoFeB magnetic tunnel junctions for read head applications", Applied Physics Letters 87, 072503 (2005). In this case, a DC-sputtered Mg layer was inserted between the CoFeB pinned layer and an RF-sputtered MgO layer, an idea initially proposed by T. Linn et al. in U.S. Pat. No. 6,841,395 to prevent oxidation of the bottom electrode (CoFe) in a CoFe/MgO(reactive sputtering)/NiFe structure. Also, a Ta getter pre-sputtering prior to RF sputtering a MgO layer can achieve 55% TMR with 0.4 ohm/$\mu m^2$ as reported by Y. Nagamine et al. in "Ultralow resistance-area product of 0.4 ohm/$\mu m^2$ and high magnetoresistance above 50% in CoFeB/MgO/CoFeB magnetic junctions", Appl. Phys. Lett., 89, 162507 (2006).

In order to achieve a smaller Hc but still maintain a high TMR ratio, the industry tends to use CoFeB as the free layer in a TMR sensor. Unfortunately, the magnetostriction ($\lambda$) of a CoFeB free layer is considerably greater than the maximum acceptable value of about 5×10$^{-6}$ for high density memory applications. A free layer made of a CoFe/NiFe composite has been employed instead of CoFeB because of its low λ and soft magnetic properties. However, when using a CoFe/NiFe free layer, the TMR ratio will degrade. Another approach is a composite free layer containing CoFeB with a positive λ and a NiFe layer with a negative λ to result in a low λ and magnetic softness for the free layer. However, a CoFeB/NiFe type free layer structure is not usable because direct contact of CoFeB with NiFe will cause a drastic drop in the MR (TMR) ratio. Thus, an improved free layer in a TMR sensor is needed that provides low magnetostriction in combination with a high TMR ratio, low RA value, and low coercivity.

U.S. Pat. No. 7,333,306 and U.S. Patent Application 2007/0047159 show a tri-layered free layer represented by CoFe/CoFeB/NiFe to achieve low coercivity and low magnetostriction for either GMR-CPP or TMR sensors.

In U.S. Patent Application No. 2007/0139827, a free layer is described that includes a sense enhancing layer (Ta) sandwiched between a first ferromagnetic (FM) layer and a second FM layer. The first FM layer has a positive magnetostriction and is made of CoFeB or CoFe based alloys while the second FM layer has negative magnetostriction and is comprised of CoFe, Ni, or NiFe based alloys.

U.S. Patent Application No. 2007/0188942 discloses a free layer comprised of three layers that include a lower NiFe or CoFe layer on the tunnel barrier layer, a Ta, Ru, Cu, or W spacer, and a CoFeB, CoFe, or NiFe upper layer.

U.S. Patent Application No. 2008/0061388 discloses a free layer with a CoFeB/Ru/CoFeTaB configuration.

U.S. Pat. No. 6,982,932 and U.S. Patent Application 2008/0152834 describe free layers that are laminations of NiFe, CoFe, and CoFeB.

A MgO tunnel barrier is formed using a natural oxidation procedure as described in U.S. Patent Application 2007/0111332.

SUMMARY OF THE INVENTION

One objective of the present invention is to provide a composite free layer that simultaneously achieves low magnetostriction, low coercivity, and a high magnetoresistive (MR) ratio with low RA in a sensor structure.

A second objective of the present invention is to provide a composite free layer according to the first objective that may be incorporated in a CIP-GMR, CPP-GMR, or TMR sensor.

A further objective is to provide a method of forming a composite free layer according to the first and second objectives that can be readily implemented in a manufacturing process and is cost effective.

According to one embodiment of the present invention, these objectives are achieved by forming a TMR sensor on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The tunnel barrier layer is preferably made of MgO, and the free layer has a composite structure represented by FL1(PT)/INS/FL2 where FL1 and FL2 are magnetic layers that may be comprised of more than one material and INS is an insertion layer which is preferably an alloy comprised of at least one magnetic element including Co, Fe, and Ni and at least one non-magnetic element such as Ta, Ti, W, Zr, Hf, Nb, Mo, V, and Cr. B may be employed as a non-magnetic element in an INS having a quaternary alloy composition. The MR ratio is enhanced by performing a weak plasma etch treatment (PT) of the FL1 layer prior to depositing the insertion layer. In one embodiment, the FL1 has a top surface comprised of CoFeB and less than about 0.2 Angstroms of the CoFeB surface is removed by the PT process comprised of low power and high Ar pressure so as not to damage the underlying tunnel barrier layer. Strong magnetic coupling between FL1 and FL2 is maintained for high performance and good device stability.

In a second embodiment, the composite free layer described previously in the TMR embodiment is formed in a GMR sensor that has a bottom spin valve structure comprised of a seed layer, AFM layer, pinned layer, non-magnetic spacer, free layer, and capping layer. The GMR sensor may have a CIP or CPP configuration.

Typically, the stack of layers in the TMR or GMR sensor is laid down in a sputtering system. All of the layers may be deposited in the same sputter chamber but the plasma treatment is preferably performed in an oxidation chamber or oxidation/etch chamber within the same sputter deposition mainframe. In the TMR embodiment, the MgO tunnel barrier is preferably formed by depositing a first Mg layer on the pinned layer followed by a natural oxidation process on the first Mg layer to form a MgO layer and then depositing a second Mg layer on the MgO layer. The oxidation step is performed in an oxidation chamber within the sputtering system. One or more annealing steps may be employed to set the magnetization direction of the AFM and pinned layers. The TMR stack is patterned by a conventional method prior to forming a top shield on the capping layer.

In yet another embodiment, the plasma treatment process may be applied to a top spin valve configuration represented by seed layer/FL2/INS/FL1(PT)/non-magnetic spacer/pinned/AFM/capping layer where the FL1 layer is treated with a weak plasma etch prior to depositing the non-magnetic spacer. According to another top spin valve embodiment, both of the FL1 and FL2 layers may be treated with a weak plasma etch to improve the crystal orientation of layers that are subsequently deposited.

DETAILED DESCRIPTION OF THE INVENTION

The present invention is a high performance magnetoresistive sensor having a composite free layer containing an insertion layer comprised of at least one magnetic element and at least one non-magnetic element formed between a first ferromagnetic layer (FL1) that has been lightly plasma etched and a second ferromagnetic layer (FL2). A method is disclosed for weakly etching FL1 and modifying its surface structure before depositing the insertion layer and FL2. While the exemplary embodiment depicts a TMR sensor in a read head, the present invention may be employed in other devices based on a magnetoresistive element such as a GMR-CPP or GMR-CIP sensor. The TMR or GMR sensor may have a bottom spin valve, top spin valve, or multilayer spin value configuration as appreciated by those skilled in the art. Magnetoresistive (MR) ratio may be used interchangeably with TMR ratio when referring to TMR sensors.

Figure 1:
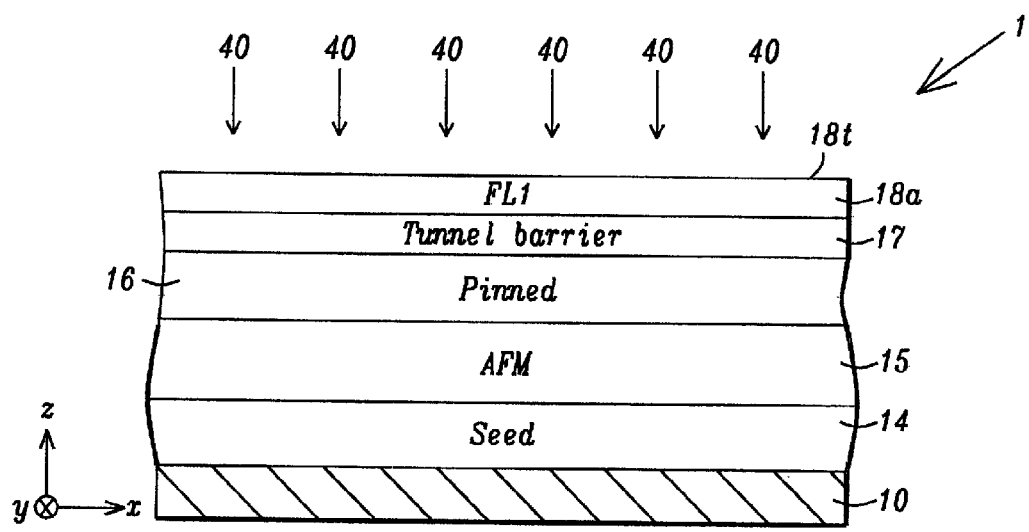
FIG. 1 is a cross-sectional view showing a TMR stack of layers with the top surface of a first ferromagnetic layer (FL1) in a FL1/INS/FL2 composite free layer of a bottom spin valve configuration that is being treated with a light etch.

Referring to FIG. 1, a portion of a partially formed TMR sensor 1 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). Typically, a first gap layer (not shown) is formed on the bottom shield. It should be understood that the substructure may be comprised of a wafer made of AlTiC, for example.

Figure 2:
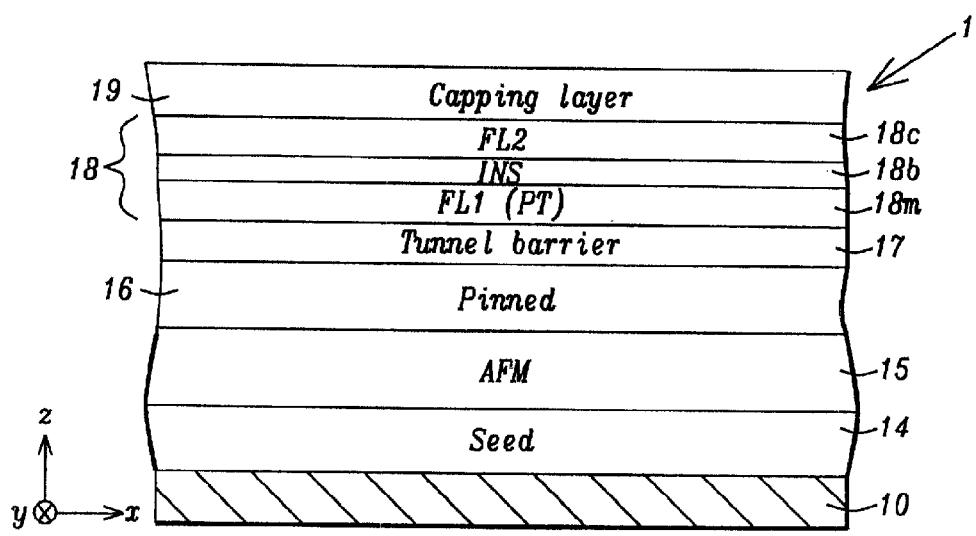
FIG. 2 is a cross-sectional view of the partially formed TMR sensor in FIG. 1 after the insertion layer (INS) and second ferromagnetic layer (FL2) are sequentially deposited on the lightly etched FL1.

A TMR stack is formed on the substrate 10 and in the exemplary embodiment has a bottom spin valve configuration wherein a seed layer 14, AFM layer 15, pinned layer 16, tunnel barrier layer 17, and a partially formed composite free layer that includes a first ferromagnetic layer FL1 18a are sequentially formed on the substrate. Subsequently, as depicted in FIG. 2, the remainder of composite free layer 18 is deposited followed by deposition of a capping layer 19 as the uppermost layer in the TMR stack. The seed layer 14 may have a thickness of 10 to 100 Angstroms and is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 has a thickness from 40 to 300 Angstroms and is preferably comprised of IrMn with a thickness between 40 and 70 Angstroms. Optionally, one of PtMn, NiMn, OsMn, RuMn, RhMn, PdMn, RuRhMn, or MnPtPd may be selected as the AFM layer.

The pinned layer 16 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 15 and may be made of CoFe with a composition of about 10 to 50 atomic % Fe and with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is preferably comprised of Ru with a thickness from 3 to 10 Angstroms, and more preferably from 7 to 8 Angstroms. The AP1 layer is also referred to as the inner pinned layer and may be a single layer or a composite layer. In one aspect, the AP1 layer is amorphous in order to provide a more uniform surface on which to form the tunnel barrier layer 17.

In the exemplary embodiment that features a bottom spin valve configuration, the tunnel barrier layer 17 is comprised of MgO because a MgO tunnel barrier is known to provide a higher TMR ratio than a TMR stack made with an AlOx or TiOx tunnel barrier. The MgO tunnel barrier layer is preferably formed by depositing a first Mg layer having a thickness between 4 and 14 Angstroms on the pinned layer 16, oxidizing the Mg layer with a natural oxidation (NOX) process, and then depositing a second Mg layer with a thickness of 2 to 8 Angstroms on the oxidized first Mg layer. The tunnel barrier is believed to have a MgO/Mg configuration immediately following deposition of the second Mg layer. The second Mg layer serves to protect the subsequently deposited free layer from oxidation. However, during an annealing step following deposition of the entire TMR stack of layers, oxygen may diffuse from the lower MgO layer into the upper Mg layer. Therefore, the final tunnel barrier layer composition is generally considered to be MgO. Note that the RA and MR ratio for the TMR sensor may be adjusted by varying the thickness of the two Mg layers in tunnel barrier layer 17 and by varying the natural oxidation time and pressure. A thicker MgO layer resulting from longer oxidation time and/or higher pressure would increase the RA value.

All layers in the TMR stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of 0.1 mTorr to 1 Torr for about 15 to 300 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA in the range of 0.5 to 5 ohm-um$^2$. A mixture of $O_2$ with other inert gases such as Ar, Kr, or Xe may also be used for better control of the oxidation process.

The present invention anticipates that a MgO barrier layer 17 could be formed by depositing a MgO layer on a pinned layer with a rf-sputtering or reactive sputtering method. It should be understood that the performance of a TMR sensor fabricated with a barrier layer comprised of sputtered MgO will not be as desirable as one made according to the preferred embodiment of this invention. For example, the inventors have observed that the final RA uniformity (1σ) of 0.6 um circular devices is more than 10% when the MgO tunnel barrier layer is rf-sputtered and less than 3% when the MgO tunnel barrier is formed by DC sputtering a Mg layer followed by a NOX process.

Optionally, other materials such as TiOx, AlTiO, MgZnO, Al₂O₃, ZnO, ZrOx, or HfOx, or any combination of the aforementioned materials including MgO may be used as the tunnel barrier layer 17.

Previously, we disclosed composite free layer structures that result in TMR or GMR sensors having high TMR ratio, low Hc with low $\lambda$, and a low RA value. For example, in related U.S. Patent Application Publication 2009/0121710, we described a CoFeB/non-magnetic/NiFe trilayer configuration for a free layer where the non-magnetic layer is made of Hf, V, Zr, Nb, Ta, Mo, or Cr. High TMR ratio is achieved because CoFeB and NiFe layers are separated by a Ta insertion layer, for example. CoFeB and NiFe are magnetically coupled through orange-peel type coupling which tends to align the magnetic moments in parallel configuration. However, this coupling is relatively weak and in a real device has to compete with magnetostatic coupling from the edge of the two ferromagnetic free layers which tends to align the magnetic moments of the CoFeB and NiFe layers anti-parallel. Moreover, stress induced anisotropy tends to align the moments for CoFeB and NiFe perpendicular to one another because of the opposite signs of magnetostriction. As a result, magnetic noise for this free layer structure is rather high. Although signal amplitude is high, improvement in signal to noise ratio (SNR) is limited and a further enhancement in SNR is desirable.

In related U.S. Patent Application Publication 2009/0122450, we demonstrated that a free layer with a trilayer configuration comprised of at least one CoFe layer having a (+) $\lambda$ value and at least one negative $\lambda$ layer such as CoB or FeB can yield a high performance sensor. Furthermore, in related patent application HT08-035, a FeCoBTa or CoTa layer is inserted between two ferromagnetic layers in a composite free layer to achieve high dR/R, low magnetoresistance, and a low RA value. Here we disclose another discovery that provides enhanced dR/R and may be incorporated in the aforementioned free layer configurations. In particular, the first ferromagnetic layer (FL1) in a composite free layer 18 represented by FL1/INS/FL2 may be modified by a weak etch treatment to generate a modified FL1 18m prior to depositing the insertion layer (INS) 18b and second ferromagnetic layer (FL2) 18c.

Returning to FIG. 1, an important feature of the present invention is the composite free layer 18 formed on the tunnel barrier layer 17. Tunnel barrier 17 has a first surface in contact with pinned layer 16 and a second surface contacting free layer 18 where both first and second surfaces are formed parallel to the substrate 10. In one embodiment, the free layer 18 has a FL1/INS/FL2 configuration wherein the FL1 layer may be a composite of two or more layers preferably including at least one CoFeB layer to result in a high dR/R ratio associated with a MgO tunnel barrier layer and a free layer comprised of CoFeB. FL1 18a has an inner surface that contacts the second surface of the tunnel barrier layer 17. There is also an outer surface 18t opposite the inner surface. Preferably, FL1 18a is ferromagnetic and has a composition represented by $Co_W Fe_{(100-W)}$ or $[Co_W Fe_{(100-W)}]_{(100-y)} B_Y$ where w is from 0 to about 100% and y is from 10 atomic % to about 40 atomic %, or the FL1 layer may be an alloy of one of the aforementioned compositions comprised of one or more additional elements such as Ni, Ta, Mn, Ti, W, Zr, Hf, Tb, Mg, and Nb. The FL1 layer 18a typically has a positive $\lambda$ value and may be a single layer or a composite with multiple layers having a thickness from 2 to 40 Angstroms that is relied upon to provide a high dR/R ratio. For example, when one of CoFeB, CoFe/CoFeB, or CoFe/CoFeB/CoFe is selected as FL1 layer 18a, the dR/R (TMR ratio) is advantageously increased. When FL1 layer 18a is a composite of two or more layers including CoFeB, the thickness of the CoFeB layer is preferably greater than the other layer or layers in the composite in order to maximize dR/R. Note that a CoFeB layer generally has a large (+) $\lambda$ value which must be offset by a (−) $\lambda$ value in one or more other layers in the free layer 18 in order to achieve a magnetostriction less than about 5×10⁻⁶ for high performance.

In the exemplary embodiment, FL1 18a is deposited and then treated with a weak plasma etch treatment (PT) indicated by reactive ions 40 that impinge on the outer surface 18t. Preferably, the PT process comprises a weak plasma etch resulting in an etch rate of less than about 0.01 Angstroms/second and removal of less than about 0.2 Angstroms FL1 18a to generate a modified FL1 18m (FIG. 2). In one aspect, the plasma etch conditions comprise a high Ar pressure of >1 E-2 (0.01) Torr and a low power of less than 20 Watts for a period of about 10 to 150 seconds. It should be understood that other inert gases such as Ne, Kr, or Xe may be employed for the PT process and the <0.2 Angstrom film loss is estimated from a separate experiment in which a light plasma etch is performed for a substantially longer period of time so that a thickness loss of significantly greater than 1 Angstrom can be measured with reasonable certainty. For example, the thickness loss of a CoFeB film after being subjected to a light plasma etch process for an hour can be divided by 60 to determine the approximate film loss after a one minute etch using the same conditions.

Although not bound by theory, it is believed that the weak PT process results in an enhanced dR/R for the TMR sensor because of one or both of the following conditions: (1) a modified surface structure of FL1 18m with respect to other portions of the first ferromagnetic layer; and (2) increased surface energy of FL1 18m to create nucleation sites and promote smooth and conformal growth in subsequently deposited insertion layer 18b, FL2 18c, and capping layer 19. When FL1 18a comprises a single CoFeB layer or a composite with an uppermost CoFeB layer, it is believed that the weak PT process helps CoFeB crystallization along a preferred orientation (100) during a subsequent annealing step and may further block the impact of a NiFe FL2 layer on the CoFeB crystal structure. Only a weak plasma etch treatment is used since a strong PT could penetrate FL1 18a and damage tunnel barrier layer 17. Preferably, the PT process is performed in an oxidation chamber or in a chamber that is acceptable for etching in a sputter deposition mainframe. Therefore, the wafer flow to form a composite free layer 18 during TMR device fabrication according to the present invention comprises formation of FL1 in a sputter deposition chamber, plasma treatment of FL1 in a separate "etch-capable" chamber as described above, and then deposition of INS 18b and FL2 18c in a sputter deposition chamber where all of the aforementioned processes occur within the same mainframe.

The insertion layer 18b is an alloy made of at least one magnetic element and at least one non-magnetic element and is deposited on the modified outer surface of FL1 18m shown as FL1(PT) in FIG. 2. The at least one magnetic element is selected from Fe, Co, and Ni, and the at least one non-magnetic element is selected from Ta, Ti, W, Zr, Hf, Nb, Mo, V, Mg, and Cr. Boron may be employed as a non-magnetic element in an insertion layer comprised of a quaternary alloy. Insertion layer 18b preferably has an overall non-magnetic character with a thickness from 2 to 10 Angstroms. By keeping the insertion layer 18b thickness constant and increasing the magnetic element content, the coupling strength between the FL1 and FL2 layers is increased but TMR ratio is decreased. Lowering the magnetic element content in the insertion layer 18b will have the opposite effect. A strong coupling (Hcp) between the FL1 layer 18a and FL2 layer 18c is desirable in order to minimize noise in the sensor and improve the signal to noise (SNR) ratio. Moreover, magnetic stability improves as the Hcp value increases. Note that insertion layer 18b has a first side that interfaces with the outer surface 18t of FL1(PT) 18m and a second (opposite) side that adjoins FL2 layer 18c.

The FL2 layer 18c is also ferromagnetic and may be a single layer or a composite having two or more layers and a thickness from 2 to 50 Angstroms. In one aspect, the FL2 layer 18c is comprised of a $Co_wFe_{(100-w)}$ layer where w is from 0 to about 100 atomic %, a $Ni_zFe_{(100-z)}$ layer where z is from about 70% to 100%, or a combination of the aforementioned layers. Furthermore, the embodiment encompasses a FL2 layer 18c that is an alloy wherein CoFe or NiFe are combined with one or more elements selected from Ni, Ta, Mn, Ti, W, Zr, Hf, Tb, Nb, or B. For example, the FL2 layer 18c may have a CoFe, NiFe, or CoFe/NiFe/CoFe composition. In an embodiment wherein CoFe/NiFe/CoFe is selected as the FL2 layer 18c, the NiFe layer is preferably substantially thicker than the CoFe layers in order to take advantage of the soft magnetic character of NiFe and the (−) λ contribution from a NiFe material to offset the (+) λ value in modified FL1 layer 18m. In a FL2 layer 18c, a NiFe layer may be sandwiched between two CoFe layers to avoid the NiFe layer contacting an insertion layer containing Ta since adjoining Ta and NiFe layers are known to form a so called "dead zone" that degrades dR/R. In general, FL2 materials or composite structures having a (−) value and that promote strong coupling through the insertion layer 18b with modified FL1 layer 18m are preferred. However, FL2 layer 18c may have a small (+) λ value when used in combination with a FL1 layer 18m having a small (+) value so that an overall λ value of $<5 \times 10^{-6}$ can be achieved for free layer 18.

With regard to insertion layer 18b, it should be understood that an alloy of a magnetic element and a non-magnetic element may be formed by co-sputtering a target of each element in a sputter deposition chamber. When multiple elements are involved as in a CoFeBTa alloy, for example, a CoFeB target may be co-sputtered with a Ta target to achieve the desired composition in the resulting CoFeBTa insertion layer. In a preferred embodiment, the ratio of CoFeB:Ta in the CoFeBTa alloy is about 2:1 to give an overall non-magnetic character for the insertion layer 18b. However, the CoFeB:Ta ratio may vary from about 1:1 to 4:1 and still retain the advantages provided by the composite free layer 18 of the present invention. In general, a CoFeB composition in the CoFeBTa alloy is preferred where Co is from about 40 to 70 atomic %, Fe is from 20 to 40 atomic %, and B is from 10 to 30 atomic %. In another preferred embodiment, CoTa is selected as the insertion layer 18b and has a Co:Ta ratio of about 2:1. Optionally, the Co content may be varied between 50 and 80 atomic % to afford a Co:Ta ratio between 1:1 and 4:1 and an overall non-magnetic character. As stated previously, increasing the content of the magnetic element which is Co in this example will increase the coupling strength between the FL1 and FL2 layers but will lower the TMR ratio. Decreasing the Co content to near 50 atomic % will lower the coupling strength but will increase the TMR ratio.

In one embodiment, the capping layer 19 formed on FL2 layer 18c may be comprised of Ru, Ta, or a combination of Ru and Ta. Optionally, the capping layer 19 may be made of other materials used in the art.

Figure 3:
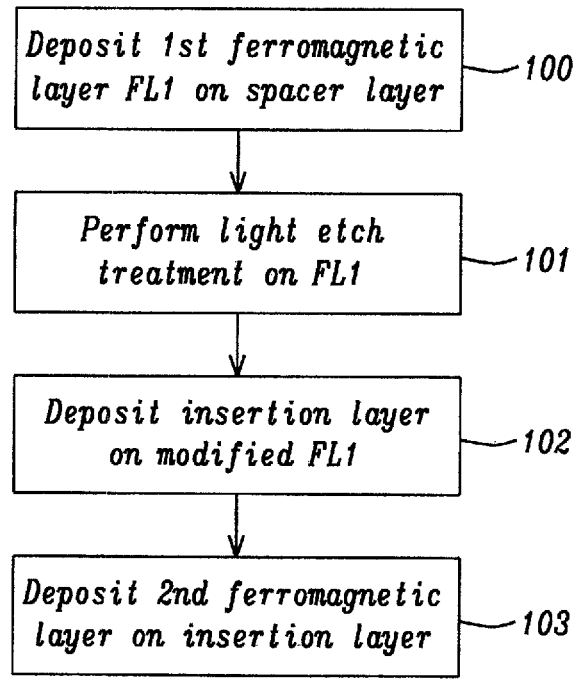
FIG. 3 shows a process flow diagram including a plasma etch treatment for forming a composite free layer according to one embodiment of the present invention.

Referring to FIG. 3, a process flow diagram is provided to further describe the formation of a composite free layer 18 according to the present invention. In step 100, a FL1 18a is deposited on a non-magnetic spacer such as a tunnel barrier layer in a TMR sensor or on a metallic spacer in a GMR sensor. In one embodiment, all steps 100-103 are performed within the same sputter deposition mainframe tool to improve throughput. Unlike steps 100, 102, and 103 which occur in sputter deposition chamber, step 101 comprises the PT process and is performed in an oxidation chamber or in an etch chamber that is capable of generating a light plasma etch condition. In step 102, the insertion layer 18b is deposited on the modified FL1 18m resulting from step 101. Finally, FL2 18c is deposited on insertion layer 18b in step 103. It should be understood that all layers 14-19 within the TMR sensor may be formed in the same sputter deposition main frame. However, the tunnel barrier layer 17 is preferably oxidized in an oxidation chamber to avoid contaminating a sputter deposition chamber with oxygen. It is important to keep oxygen out of the free layer 18 so as not to degrade magnetic properties and decrease the magnetoresistance ratio.

Once the TMR stack is complete, the partially formed read head 1 may be annealed in a vacuum oven within the range of 240° C. to 440° C. with an applied magnetic field of at least 2000 Oe, and preferably >8000 Oe, for about 30 minutes to 10 hours to set the pinned layer and free layer magnetization directions. The present invention also anticipates that the anneal process may include at least two steps as we have previously disclosed in U.S. Patent Application Publication 2009/0229111. It should be understood that under certain conditions, depending upon the time and temperature involved in the anneal process, the tunnel barrier layer 17 may become a uniform MgO tunnel barrier layer as unreacted oxygen in the lower MgO layer diffuses into the adjacent Mg layer in the MgO/Mg stack.

Figure 4:
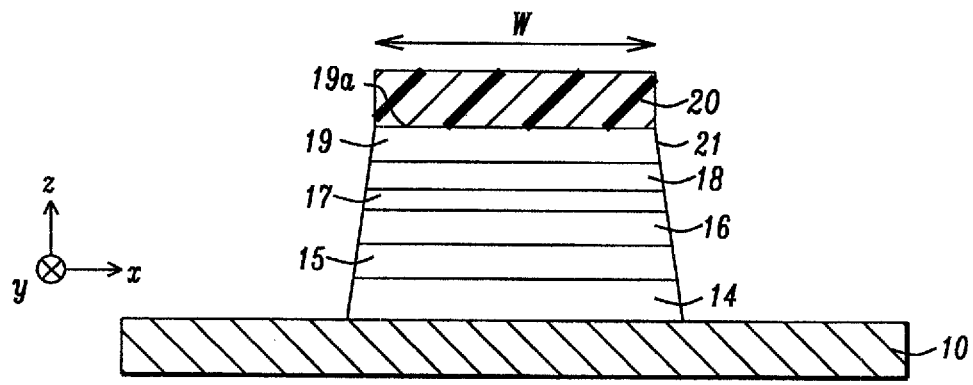
FIG. 4 is a cross-sectional view showing a TMR stack of layers that has been patterned to form a MTJ element during an intermediate step of fabricating the TMR sensor according to one embodiment of the present invention.

Referring to FIG. 4, the TMR stack is patterned by following a conventional process sequence. For example, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process may stop on the first gap layer above the bottom shield 10 or between the bottom shield and a barrier layer (not shown) to give a TMR sensor with a top surface 19a and sidewalls 21.

Figure 5:
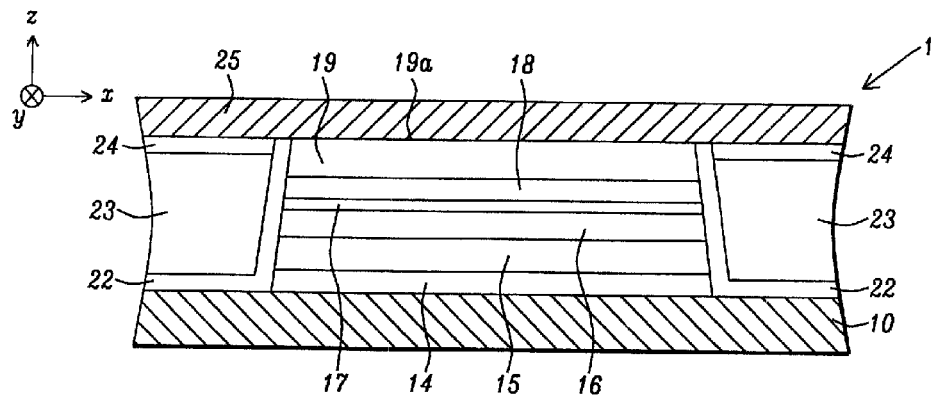
FIG. 5 is a cross-sectional view of a TMR read head having a MTJ element interposed between a top shield and bottom shield and formed according to an embodiment of the present invention.

Referring to FIG. 5, an insulating layer 22 may be deposited along the sidewalls 21 of the TMR sensor. The photoresist layer 20 is then removed by a lift off process. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) formed between the top surface 19a and the top shield 25.

Figure 6:
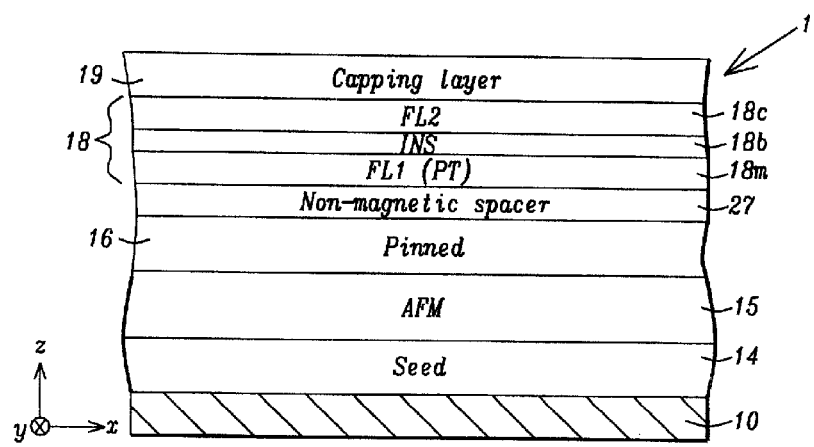
FIG. 6 is a cross-sectional view of a GMR read head having a composite free layer according to a second embodiment of the present invention.

In a second embodiment represented by FIG. 6 that relates to a GMR-CPP or GMR-CIP device, the magnetoresistive element 1 is a stack of layers which is the same as described previously except the tunnel barrier layer 17 is replaced by a non-magnetic spacer layer 27 that may be Cu, for example. The modified FL1 in composite free layer 18 contacts a top surface of the non-magnetic spacer 27. The magnetoresistive element 1 may be patterned by the same sequence of steps described previously with respect to FIG. 4. Alternatively, the non-magnetic spacer in a GMR CPP device may have a confining current path (CCP) configuration wherein an insulating layer such as a metal oxide having metal paths formed therein is sandwiched between a first metal layer and a second metal layer. For example, the first and second metal layers may be Cu and an AlOx layer with Cu paths therein may be formed between the two Cu layers as understood by those skilled in the art.

Figure 7:
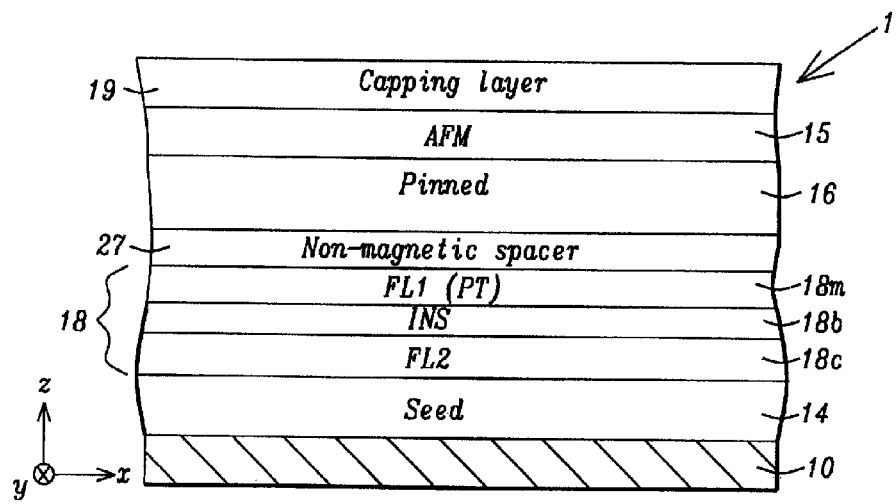
FIG. 7 is a cross-sectional view showing a TMR stack of layers with a top spin valve configuration wherein the top surface of a first ferromagnetic layer (FL1) in a FL2/INS/FL1 composite free layer was treated with a weak plasma etch before depositing a non-magnetic spacer and other overlying layers.

Referring to FIG. 7, the present invention also encompasses an embodiment where the TMR (or GMR) sensor has a top spin valve configuration. The same set of materials and processes are used as previously described with respect to the bottom spin valve embodiments. In one aspect, the top spin valve configuration may be represented by seed/FL2/INS/FL1(PT)/non-magnetic spacer/pinned/AFM/capping layer. A key feature is that a top (inner) surface of FL1 has been treated with a light plasma etch to form FL1(PT) 18m prior to formation of non-magnetic spacer 27, and other overlying layers. The outer surface of FL1 18m is still considered to be the side contacting the insertion layer 18b whereas the inner surface of FL1 is the side contacting the non-magnetic spacer 27. Similar to the previous embodiments, it is believed that the light plasma etch treatment described previously modifies the surface of a ferromagnetic layer which is FL1. Preferably, FL1 comprises CoFeB. In an embodiment with a composite FL1 layer, there is preferably an uppermost CoFeB layer in the FL1 stack so that the light plasma etch will have the largest impact in modifying surface texture and/or modifying surface energy to promote a favorable crystal orientation in subsequently deposited layers. However, PT treatment of NiFe, CoFe, or alloys thereof which are formed as the uppermost FL1 layer is also expected to provide a benefit in terms of improved magnetic properties such as a higher magnetoresistive ratio.

Figure 8:
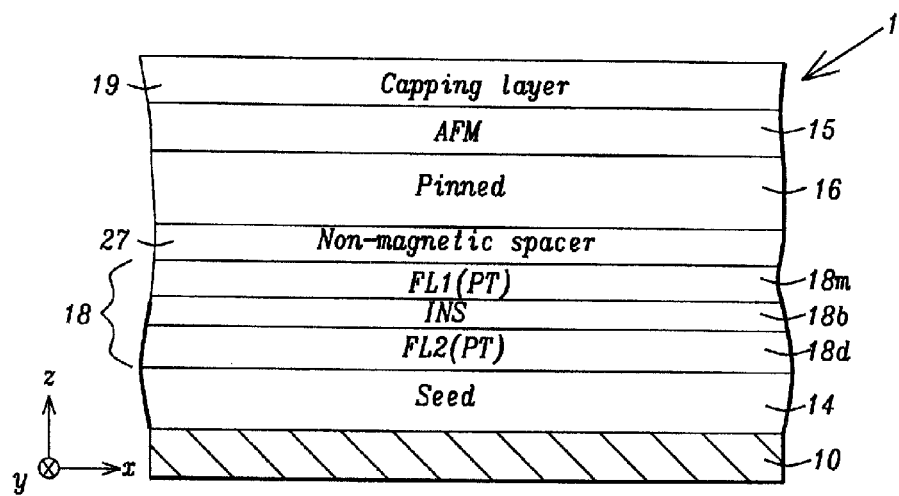
FIG. 8 is a cross-sectional view showing a TMR stack of layers with a top spin valve configuration wherein the top surface of a second ferromagnetic layer (FL2) in a FL2/INS/FL1 composite free layer was treated with a light plasma etch before depositing the insertion layer and FL1, and FL1 was treated with a light plasma etch before depositing overlying layers.

In yet another top spin valve embodiment illustrated in FIG. 8, the TMR (or GMR) sensor in FIG. 7 may be further modified by treating the FL2 layer 18c with a light plasma etch to generate a FL2(PT) 18d layer prior to depositing the insertion layer 18b and overlying layers. Thus, FL2 18c may be treated with a first light plasma etch to form FL2(PT) 18d, and subsequently following deposition of INS 18b and FL1 18a, the FL1 layer may be treated with a second light plasma etch to produce FL1(PT) 18m. Thus, the inner surface of FL2 18d is believed to have one or both of a modified structure or increased surface energy with respect to other portions of the FL2. As indicated earlier, the preferred embodiment is where FL1 is comprised of CoFeB or where FL1 is a composite with an uppermost CoFeB layer. However, CoFe or an alloy thereof as the uppermost layer in a composite FL1 stack is also expected to generate an improvement in MR ratio while maintaining other acceptable magnetic properties in the TMR (or GMR) sensor.

Comparative Example 1

An experiment was conducted to demonstrate the improved performance achieved by implementing a composite free layer in a TMR sensor according to the present invention. Three TMR stacks hereafter referred to as Wafer A, Wafer B, and Wafer C shown in Table 1 were fabricated on six inch AlTiC wafers. Wafer A represents a TMR structure as previously disclosed in related application HT08-035 in which CoFeBTa is employed as an insertion layer between two ferromagnetic layers in a composite free layer. Wafer B is a TMR stack formed according to an embodiment of the present invention and is similar to Wafer A except the FL1 in the FL1/INS/FL2 composite free layer is modified with a PT process before the insertion layer and FL2 are deposited. Wafer C is the same as Wafer A except a thin CoFe layer is inserted between a CoFeB FL1 layer and the insertion layer to improve the MR ratio. In all three examples, the TMR stacks have a composition represented by Ta/Ru/IrMn/CoFe/Ru/CoFe/MgO/free layer/capping layer. Ta/Ru is a composite seed layer wherein both Ta and Ru layers have a 20 Angstrom thickness. The AFM layer is IrMn and has a 70 Angstrom thickness. The pinned layer has an AP2/Ru/AP1 structure in which the AP2 layer is a 25 Angstrom thick $Co_{75}Fe_{25}$ layer, the Ru coupling layer has a 7.5 Angstrom thickness, and the AP1 layer is a 25 Angstrom thick $Co_{75}Fe_{25}$ layer. The MgO tunnel barrier was formed by depositing a 7 Angstrom thick lower Mg layer that was subjected to a NOX process before a 3 Angstrom thick upper Mg layer was deposited. The capping layer in this example is Ru/Ta wherein the lower Ru layer is 10 Angstroms thick and the upper Ta layer is 60 Angstroms thick. The free layer has a FL1/insertion layer/FL2 configuration in which FL1 is $Co_{90}Fe_{10}3/Co_{60}Fe_{20}B_{20}10$ and FL2 is $Ni_{90}Fe_{10}30$ where the numbers following CoFe, NiFe, and CoFeB indicate the thickness of that particular layer. The CoFeBTa insertion layer is 6 Angstroms thick in all examples. TMR stacks were formed on a NiFe shield and were annealed under vacuum at 280° C. for 5 hours with an applied field of 8000 Oe before patterning to form 0.8 micron circular devices. All wafers listed in Table 1 have reasonably good magnetic softness including coercivity around 4 to 5 Oe and λ of approximately $1 \times 10^{-6}$.

TABLE 1

Magnetic properties of TMR sensors with Ta/Ru/IrMn/CoFe/Ru/CoFe/MgO/free/cap configuration

| Wafer ID | Free Layer Structure | RA | MR ratio dR/R ave. |
|---|---|---|---|
| A | CoFe3/CoFeB10/CoFeBTa6/NiFe30 | 1.0 | 58.5% |
| B | CoFe3/CoFeB10/PT/CoFeBTa6/NiFe30 | 1.0 | 63.7% |
| C | CoFe3/CoFeB10/CoFe3/CoFeBTa6/NiFe30 | 1.0 | 61.0% |

As shown in Table 1, a PT process applied to the FL1 layer (CoFe3/CoFeB10) in Wafer B can increase the MR ratio by 9% relative to wafer A. As indicated earlier, the enhanced MR ratio is understood to result from a modification of the CoFeB surface by the weak plasma etch treatment in a manner that helps CoFeB crystallization along a preferred orientation and by increasing surface energy and thereby creating nucleation sites. Although an additional CoFe layer in Wafer C also generates a higher MR ratio, this alternative is not desirable because of a thicker TMR stack and a higher Bs which means a weaker effective coupling field (Hcp) between FL1 and FL2.

All samples in Table 1 demonstrate that a high dR/R and low RA can be achieved with a CoFeBTa insertion layer formed between two ferromagnetic layers. However, Wafer B which includes a PT process applied to the FL1 provides the best overall performance and is more desirable for producing advanced TMR (and GMR) sensors. Furthermore, a high Hcp is achieved by selecting a 6 Angstrom thick film of CoFeBTa as the insertion layer. The CoFeB:Ta composition ratio is about 2:1 and the single layer of CoFeBTa is non-magnetic at this composition. As stated earlier, by decreasing the insertion layer thickness, dR/R decreases but Hcp increases. On the other hand, increasing the insertion layer thickness above 6 Angstroms (not shown) would increase dR/R but lower the Hcp value. Further optimization of dR/R and Hcp is possible by adjusting the magnetic:non-magnetic element ratio in the insertion layer. Moreover, λ for the composite free layer may be adjusted by varying the composition or thickness of the NiFe layer with minimal effect on dR/R. All samples listed in Table 1 have reasonably good magnetic softness with a coercivity (Hc) around 4 to 5 Oe and λ of about $1 \times 10^{-6}$. Magnetic properties were obtained from 0.8 micron circular devices. It should be understood that the dR/R values will increase as the sensor size decreases.

The advantages of the present invention are that a high TMR ratio of greater than 60% can be achieved simultaneously with a low RA value of about 1 ohm-um$^2$ and low magnetostriction of approximately $1 \times 10^{-6}$ which is a significant improvement over the prior art. Furthermore, soft magnetic properties (low Hc) are realized with a composite FL1 (PT)/INS/FL2 free layer composition as disclosed herein. The PT process may be implemented with a minimal effect on device cost or manufacturing throughput since the weak plasma etch may be performed in the same sputter deposition mainframe in which the TMR or GMR sensor stack is formed. A low temperature anneal process may be employed which is compatible with the processes for making GMR sensors.

While this invention has been particularly shown and described with reference to, the preferred embodiment thereof, it will be understood by those skilled in the art that various changes in form and details may be made without departing from the spirit and scope of this invention.

We claim:

1. A method of forming a magnetoresistive element in a TMR sensor, comprising:
   (a) forming a seed layer on a substrate;
   (b) depositing a first ferromagnetic layer (FL2) on the seed layer, said (FL2) layer has an inner surface contacting the seed layer, an outer surface facing away from the seed layer, and is comprised of one or more of $Co_wFe_{(100-w)}$ where w is from 0 to about 100 atomic %, $Ni_zFe_{(100-z)}$ where z is from about 70% to 100%, and an alloy wherein CoFe or NiFe are combined with one or more elements selected from Ni, Ta, Mn, Ti, W, Zr, Hf, Tb, Nb, and B;
   (c) performing a weak plasma etch treatment (PT) on the outer surface of said first ferromagnetic layer (FL2) thereby forming a modified (FL2) layer that has one or both of a modified surface structure and increased surface energy with respect to other portions of the (FL2) layer;
   (d) sequentially depositing an insertion layer (INS) and a second ferromagnetic layer (FL1) on the modified surface of the first ferromagnetic layer (FL2) to give a composite free layer with a (FL2)(PT)/(INS)/(FL1) configuration, said insertion layer has at least one magnetic element selected from Fe, Co, and Ni and at least one non-magnetic element selected from Ta, Ti, W, Zr, Hf, Nb, Mo, V, Mg, and Cr, and said second ferromagnetic layer is comprised of one or more of $Co_wFe_{(100-w)}$, $[Co_wFe_{(100-w)}]_{(100-y)}B_y$ where w is from 0 to about 100% and y is from 10 atomic % to about 40 atomic %, and an alloy of $Co_wFe_{(100-w)}$, or $[Co_wFe_{(100-w)}]_{(100-y)}B_y$ that is comprised of one or more additional elements including Ni, Ta, Mn, Ti, W, Zr, Hf, Tb, and Nb;
   (e) sequentially forming a non-magnetic spacer, pinned layer, and antiferromagnetic (AFM) layer on the (FL1) layer; and
   (f) forming a capping layer on the AFM layer.

2. The method of claim 1 wherein the non-magnetic spacer is a tunnel barrier layer that is comprised of one or more of MgO, MgZnO, ZnO, $Al_2O_3$, TiOx, AlTiO, HfOx and ZrOx.

3. The method of claim 2 wherein the tunnel barrier is comprised of MgO and wherein formation of the MgO tunnel barrier layer is comprised of depositing a first Mg layer, performing a natural oxidation process to form a MgO layer, and then depositing a second Mg layer on the MgO layer.

4. The method of claim 1 further comprised of performing an annealing step after step (f) wherein the annealing conditions comprise a temperature between about 240° C. and 340° C. with an applied magnetic field of at least 2000 Oe for about 2 to 10 hours.

5. The method of claim 1 wherein the second ferromagnetic layer has a thickness from about 2 to 40 Angstroms and is comprised CoFeB, CoFe/CoFeB, or CoFe/CoFeB/CoFe.

6. The method of claim 1 wherein the insertion layer has a thickness from about 2 to 10 Angstroms and is further comprised of B to give a CoFeBTa composition wherein the ratio of CoFeB to Ta is from about 1:1 to 4:1.

7. The method of claim 1 wherein the insertion layer has a CoTa composition wherein the ratio of Co to Ta is from about 1:1 to 4:1.

8. The method of claim 1 wherein the first ferromagnetic layer has a thickness from about 2 to 50 Angstroms and is comprised of CoFe, NiFe, or CoFe/NiFe/CoFe.

9. The method of claim 1 wherein the weak plasma etch comprises Ar or another inert gas at a pressure greater than about 0.01 Torr and with a power less than about 20 Watts.

10. The method of claim 1 further comprised of performing a weak plasma etch treatment (PT) on a top surface of the second ferromagnetic layer (FL1) prior to depositing the non-magnetic spacer.

* * * * *